United States Patent
Sander

(10) Patent No.: US 11,815,550 B2
(45) Date of Patent: Nov. 14, 2023

(54) SIGNAL PROCESSING APPARATUS AND METHOD FOR MIXING A HIGH FREQUENCY SIGNAL

(71) Applicant: Rohde & Schwarz GmbH & Co. KG, Munich (DE)

(72) Inventor: Kay-Uwe Sander, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 355 days.

(21) Appl. No.: 16/986,388

(22) Filed: Aug. 6, 2020

(65) Prior Publication Data
US 2022/0043061 A1    Feb. 10, 2022

(51) Int. Cl.
*G01R 31/317* (2006.01)
*H03M 1/12* (2006.01)
*G01R 23/02* (2006.01)

(52) U.S. Cl.
CPC ....... *G01R 31/31708* (2013.01); *G01R 23/02* (2013.01); *H03M 1/124* (2013.01)

(58) Field of Classification Search
CPC .. G01R 31/00; G01R 31/31708; G01R 23/02; H03M 1/124
See application file for complete search history.

(56) References Cited

U.S. PATENT DOCUMENTS

| | | | | |
|---|---|---|---|---|
| 5,179,344 A | * | 1/1993 | Najle | G01R 29/26 455/226.1 |
| 11,050,430 B1 | * | 6/2021 | Feldhaus | H03M 1/127 |
| 2008/0246881 A1 | * | 10/2008 | Kim | H04L 1/0071 348/E5.077 |
| 2012/0076252 A1 | * | 3/2012 | Futami | H04L 27/0012 375/376 |
| 2012/0313697 A1 | * | 12/2012 | Hafizovic | H03D 1/22 329/323 |
| 2020/0174061 A1 | * | 6/2020 | Weiss | G01R 31/2822 |
| 2022/0286161 A1 | * | 9/2022 | Wang | H04B 3/54 |

FOREIGN PATENT DOCUMENTS

KR    101184331 B1    9/2012

* cited by examiner

*Primary Examiner* — Son T Le
*Assistant Examiner* — Matthew W. Baca
(74) *Attorney, Agent, or Firm* — Westman, Champlin & Koehler, P.A.

(57) ABSTRACT

The present invention relates to a processing of a signal under test in order to compensate frequency variations in the signal under test. For this purpose, the signal under test is mixed with a further digital signal. A frequency of the further signal which is used for mixing with the signal under test may be adapted in real-time according to frequency variations in the signal under test.

16 Claims, 3 Drawing Sheets

SIGNAL PROCESSING APPARATUS AND METHOD FOR MIXING A HIGH FREQUENCY SIGNAL

TECHNICAL FIELD

The present invention relates to a signal processing apparatus and method for mixing a high frequency signal. In particular, the present invention relates to mixing of a high frequency signal with frequency variation to a predetermined frequency bandwidth.

BACKGROUND

Even though applicable in general to any kind of high frequency signal, the present invention and its underlying problem will be hereinafter described in conjunction with measurement of signal power of a high frequency signal.

A precise and reliable measurement of high frequency power is important for calibrating an output level of a signal generator of a high frequency system. For example, a spectrum analyzer or measurement receiver may measure a signal level of a signal with a relative small bandwidth. However, the frequency of the signal source may slightly change over time. Furthermore, at least some components of the measurement system, for example a frequency converter, may also have only limited frequency stability. Thus, the bandwidth of the measurement system has to cover a relative broad frequency range in order to cover such variations when measuring the radio frequency signal.

Against this background, a problem addressed by the present invention is to provide a signal processing for high frequency signals with a frequency variation. In particular, the present invention aims to provide an apparatus and a method for processing signals which allows measurement of power levels with a relative small bandwidth even in case of frequency variations.

SUMMARY

The present invention provides a signal processing apparatus and a method for mixing high frequency signals with the features of the independent claims. Further advantageous embodiments are subject matter of the dependent claims.

According to a first aspect, a signal processing apparatus for mixing a high frequency signal is provided. The signal processing apparatus may mix high frequency signals with frequency variations to a predetermined frequency. The signal processing apparatus comprises an input, an analogue-to-digital converter, a numerically-controlled oscillator (NCO), a digital frequency converter and a frequency tracking device. The input may be configured to receive an analogue signal under test. In particular, the input may receive an analogue high frequency signal with frequency variations. The analogue-to-digital converter may be configured to digitize the received analogue signal under test. The NCO may be configured to generate a digital signal with a predetermined frequency. The digital frequency converter may be configured to mix the digitized signal under test which is provided by the analogue-to-digital converter and the digital signal generated by the NCO. Accordingly, the digital frequency converter may provide an output signal according to the result of this mixing operation. The frequency tracking device may be configured to track a frequency of the analogue signal under test. Additionally or alternatively, the frequency tracking device may be configured to track the digitized signal under test.

The NCO is further configured to set the predetermined frequency of the NCO based on the frequency which is tracked by the frequency tracking device.

According to a further aspect, a method for mixing a high frequency signal with a frequency variation to a predetermined frequency bandwidth is provided. The method comprises receiving an analogue signal under test. The analogue signal under test may be received, for example by an input device. The method further comprises digitizing the received analogue signal under test. For example, the received analogue signal under test may be digitized by an analogue-to-digital converter. Further, the method comprises tracking a frequency of the analogue signal under test. Additionally or alternatively, the digitized signal under test may be tracked. The tracking may be performed by a frequency tracking device. The method further comprises generating a digital signal with a predetermined frequency. The predetermined frequency may be set based on the tracked frequency. The generation of the digital representation of a waveform may be performed by a numerically control oscillator. Finally, the method may comprise mixing the digitized signal under test and the generated digital signal. The mixing may be performed, for example, by a digital frequency converter.

The present invention is based on the finding that a precise determination of a power level of a high frequency signal may be important for calibrating a signal generator. For this purpose, it may be necessary to measure a high frequency signal within a relative small bandwidth. However, a frequency of the signal source may slightly vary and/or frequency variations in the measurement system may occur. Thus, a bandwidth for measuring a power level usually has to be set to a relative broad bandwidth in order to compensate such frequency variations.

The present invention takes into account this finding and aims to provide an apparatus and a method which can compensate such frequency variations in the signal source or further components of the measurement system. For this purpose, the present invention proposes converting a high frequency signal into a digital domain and perform a frequency tacking of the signal in the digital domain. Based on this frequency tracking, the high frequency with the frequency variation is mixed with a further signal, wherein a frequency of the further signal is adapted based on the tracking of the frequency of the signal to be measured. Thus, by mixing a high frequency signal with frequency variations and a further signal which also takes into account this frequency variation, the result of this mixing operation provides a signal in a stabilized frequency range. In other words, the variations in a frequency of the signal to be measured are eliminated in the result of the mixing operation. Thus, the result of this mixing operation can be further processed and measured within a relative small bandwidth. In particular, it is no longer necessary to broaden the bandwidth to consider the frequency variations of the original signal to be measured.

The signal to be measured may be a radio frequency signal, for example a radio frequency signal provided by a signal generator. Accordingly, by the processing of the received radio frequency signal, it may be possible to precisely analyze the radio frequency signal, for example for determining a power level or the like. Since the result of the signal processing can be performed within a relative small bandwidth, disturbances such as noise or the like may be reduced by analyzing the result only within a relative small bandwidth. Thus, the further operations, for example a determination of a power level or the like can be further improved.

The input for receiving the signal under test may be any kind of appropriate input device. For example, the signal under test may be received by an input terminal and directly forwarded to the analogue-to-digital converter. However, if appropriate, it may be also possible that the input may provide an appropriate impedance which is adapted to a cable or any other element providing the signal under test. Furthermore, the input may also comprise additional elements such as resistors, inductors, capacitors or the like or even attenuators or amplifiers.

The received analogue signal under test may be converted to a digital signal by means of an analogue-to-digital converter. For this purpose, any kind of appropriate analogue-to-digital converter may be used. In particular, it may be possible to digitize the analogue signal under test by a predetermined sampling rate and/or with a predetermined resolution. It is understood, that constraints such as a sampling rate according to the Nyquist criterion or the like have to be considered for digitizing the analogue signal under test.

The tracking device may receive as an input the analogue signal under test or the digitized signal under test. The tracking device analyzes the received analogue or digital signal under test in order to determine variations in the frequency of the signal under test. For example, the tracking of the frequency may be performed by a phase-locked loop (PLL) or the like. However, any other appropriate approach for tracking the frequency of the signal under test may be also possible. Accordingly, the tracking device identifies variations in the frequency of the signal under test.

Based on the tracking of the frequency of the signal under test, the frequency of the NCO is adapted accordingly. For example, the frequency of the NCO may be adapted such that the frequency of the digital signal output by the NCO changes in the same manner as the frequency of the signal under test. In this way, a variation in the frequency of the signal under test may result in a similar or same variation of the frequency of the waveform provided by the NCO.

The NCO may be any kind of appropriate NCO for generating a digital signal with a predetermined frequency. Since NCOs (numerically-controlled oscillators) are well-known in the art, a further, more detailed explanation is omitted here. The NCO may provide a digital representation of a signal waveform with the predetermined frequency.

The output of the NCO is provided to a digital frequency converter. The digital frequency converter further receives the digitized signal under test. The digital frequency converter performs a mixing operation of the digitized signal under test at the output of the NCO. Accordingly, the output of the digital frequency converter corresponds to the result of the mixing of the signal under test and the output of the NCO. In particular, the output of the mixing operation may comprise a sum and a difference of the two input signals. Since the frequency of the output of the NCO changes in the same manner as the frequency of the signal under test changes, the result of the mixing operation compensates the variations in the frequency of the signal under test. Thus, the output of the digital frequency converter is compensated with respect of the frequency variations of the signal under test.

Accordingly, the output of the frequency converter can be further processed within a relative small bandwidth.

Further embodiments of the present invention are subject of the further subclaims and of the following description referring to the drawings.

In a possible embodiment, the predetermined frequency of the NCO is continuously adapted in response to a variation of the frequency tracked by the frequency tracking device. In particular, the frequency of the NCO is continuously adapted in real-time. By continuously adapting the frequency of the NCO in real-time, the output of the NCO may follow the frequency variations of the signal under test, and thus, the digital frequency converter is always is provided with a digital signal having frequency variations corresponding to the frequency variations of the signal under test.

Accordingly, the output of the digital frequency converter is a signal wherein the frequency variations of the signal under test are compensated.

In a possible embodiment, the frequency tracking device may comprise a phase-locked loop (PLL). A PLL may provide a control loop for analyzing variations in an input signal and providing an output signal in response to the variations of the input signal. In this way, frequency variations of the signal under test can be easily tracked and the frequency of the NCO may be adapted accordingly.

In a possible embodiment, the predetermined frequency of the NCO may be set to the tracked frequency, in particular the frequency which is tracked by the tracking device.

By setting the frequency of the NCO to the same frequency as the frequency of the signal under test which has been tracked by the tracking device, the digital frequency converter may mix the signal under test with a further signal having the same frequency. Accordingly, the output of this mixing operation results in a baseband signal.

In a possible embodiment, an offset may be added to the tracked frequency, and the sum of the offset and the tracked frequency is used to set the predetermined frequency of the NCO. Accordingly, the result of the mixing operation a digital frequency converter results in an output signal having a frequency corresponding to this offset.

In a possible embodiment, the signal processing apparatus comprises an analogue frequency converter. The analogue frequency converter may be configured to convert the received analogue signal under test to an intermediate frequency. The converted signal under test to the intermediate frequency is provided to the analogue-to-digital converter. Accordingly, a first down conversion of a high frequency signal is performed in an analogue domain by down converting the signal to the intermediate frequency. Subsequently, the intermediate frequency signal is processed in order to compensate frequency variations as described above. For example, the frequency conversion may be performed by mixing an input signal with a further frequency signal, provided, for example, by a local oscillator.

In a possible embodiment, the signal processing apparatus comprises a filter. The filter may be configured to receive an output of the digital frequency converter and apply a filtering by a predetermined filter bandwidth. In particular, the filter may apply the predetermined filter bandwidth to the output of the digital frequency converter. Thus, the filter may perform a digital filtering of the output of the digital frequency converter. By filtering the signal, disturbances such as noise outside or the like can be eliminated.

In a possible embodiment, the filter may comprise a low-pass filter. However, it is understood, that depending on the desired operation, any other kind of filter may be also used. For example, if the digital frequency converter performs a conversion to the baseband, noise or the like which relates to higher frequencies can be eliminated.

In a possible embodiment, the filter may be configured to apply a narrow filter bandwidth. Especially, the filter bandwidth may be equal or less than 10 Hz. However, it is understood, that depending on the desired application any other appropriate filter bandwidth may be used. For example, the filter bandwidth may be equal or less than 100 Hz, equal or less than 50 Hz, or equal or less than 5 Hz. In any case, due to the compensation of the frequency variations, the filter bandwidth may be set smaller than a filter bandwidth used for a system without a frequency compensation.

In a possible embodiment, the apparatus may comprise a power detector. The power detector may be configured to determine a power level of the output of the digital frequency converter. In particular, the power detector may determine a power level of the filtered signal output by the filter.

By determining the power level of the signal, an analysis of the signal under test can be performed. For example, a calibration of a signal source providing the signal under test can be performed.

With the present invention it is therefore possible to consider and compensate frequency variations of a high frequency signal. In particular, the present invention proposes to track variations in a frequency of a signal under test in a digital domain. Based on the tracked frequency variations, a further digital frequency signal is generated, and the digitized signal under test and the further digital signal are mixed. Since both input signals of the mixing operation may have same or similar frequency variations, the output of this mixing operation results in a signal having almost constant frequency characteristics. Thus, the output of this mixing operation can be applied to further operations within a relative small frequency range. For example, subsequent filter operations within a small filter bandwidth can be applied in order to eliminate noise or other disturbances.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

Figure 1:
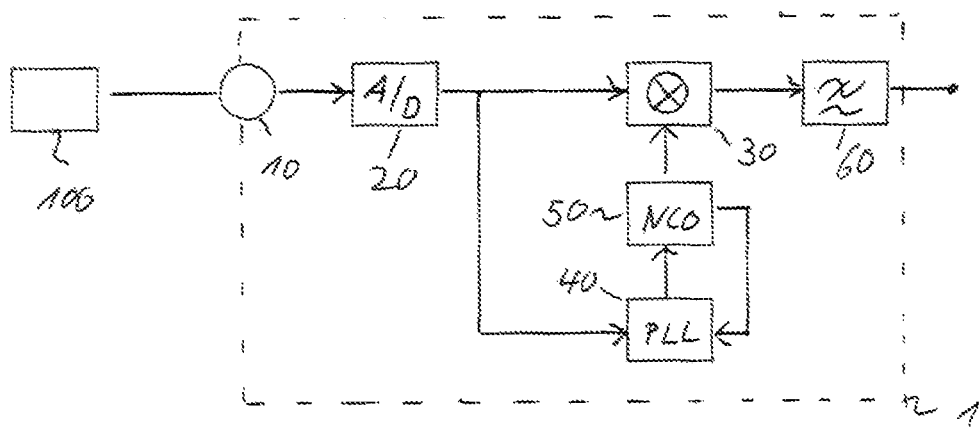
FIG. 1: shows a schematic block diagram of a signal processing apparatus according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DESCRIPTION OF EMBODIMENTS

FIG. 1 shows a schematic block diagram of a signal processing apparatus 1 according to an embodiment. The signal processing apparatus 1 comprises an input 10, an analogue-to-digital converter 20, a digital frequency converter 30, a frequency tracking device 40 and a numerically-controlled oscillator (NCO) 50. As will be described below in more detail, signal processing apparatus 1 may comprise further components such as, for instance, a filter 60.

Input 10 may receive an analogue signal under test. For example, the analogue signal under test may be generated by a signal generator 100. The signal under test may be a radio frequency signal of a specific frequency. However, due to numerous effects, the frequency of the signal under test may slightly vary around the desired frequency. For example, variations in the temperature of the signal generator may cause variations in the frequency of the generated signal. However, any other impact that may cause a variation in the frequency of the generated signal may be possible, too. The signal generated by the signal generator may be a simple test signal relating only to a single frequency. However, it may be also possible that the generated signal under test may be a modulated signal. For example, the signal under test may comprise a baseband signal with a specific bandwidth which is mixed into a carrier frequency.

The analogue signal under test may be received by input 10. For this purpose, input 10 may comprise an appropriate terminal or connector for connecting a cable. For example, input 10 may be connected to the signal generator 100 by a radio frequency cable. However, it may be also possible that input 10 is connected to an antenna or antenna system for receiving the signal under test. It is understood, that any other manner for receiving the signal under test may be possible, too.

Input 10 may be directly connected to analogue-to-digital converter 20. However, it may be also possible that further components may be included in the signal path between input 10 and the analogue-to-digital converter 20. For example, input 10 may comprise components such as resistors, capacitors or inductors for adapting an input impedance.

Analogue-to-digital converter 20 may digitize the analogue signal under test which has been received by input 10. For this purpose, analogue-to-digital converter 20 may sample the signal under test by a predetermined sampling rate in order to obtain digital data having a specific resolution. For this purpose, any kind of appropriate analogue-to-digital converter may be used. It is understood, that the sampling rate of the analogue-to-digital converter 20 has to be set in an appropriate manner with respect to the expected frequency of the signal under test. In particular, the requirements of the Nyquist criterion have to be considered. The digitized signal under test may be provided to an input port of digital frequency converter 30. Digital frequency converter 30 may mix the digitized signal under test with a further signal. This further signal may be generated by a numerically controlled oscillator (NCO) 50 as will be described below in more detail.

As further illustrated in FIG. 1, tracking device 40 may receive the digitized signal under test. Alternatively, it may be also possible that tracking device 40 may receive the analogue signal under test. Further, tracking device 40 may track a frequency of the signal under test. In this way, tracking device 40 may identify variations in the frequency of the signal under test. For example, the tracking of the frequency may be performed by a phase-locked loop (PLL). However, any other appropriate manner for tracking the frequency, in particular variations in the frequency of the signal under test may be possible, too.

The result of the tracking of the frequency of the signal under test may be provided to NCO 50. NCO 50 may generate a digital signal, in particular a digital representation of a waveform with a predetermined frequency, based on the tracked frequency of the signal under test. For example, the frequency of the signal which is generated by the NCO 50 may change in a manner corresponding to the variation of the frequency of the signal under test which has been tracked by the tracking device 40. For this purpose, tracking device 40 may receive the output signal provided by the NCO 50 and compare this output signal with the signal under test. The result of this comparison may be provided to the NCO 50, and NCO 50 may adapt the frequency of the output signal in response to this result of comparison.

For example, it may be possible to analyze a phase difference between the signal under test and the signal provided by NCO 50. Based on the result of this analysis of the phase difference, the NCO 50 may adapt the frequency of the output signal accordingly in order to minimize the phase difference or a variation of the phase difference. However, it is understood, that any other manner for controlling the output signal of the NCO 50, in particular the frequency of the output signal of NCO 50 may be possible, too.

Digital frequency converter 30 may mix the digitized signal under test provided by analogue-to-digital converter 20 and the output of NCO 50. For this purpose, digital frequency converter 30 may comprise, for example, a digital mixer. However, any manner for performing the mixing operation of the digitized signal under test and the output of NCO 50 may be possible.

In case that the output of NCO 50 is controlled such that the frequency of this output corresponds to the frequency of the signal under test, the output of the digital frequency converter 30 may provide the baseband signal.

Alternatively, it may be possible to apply an offset between the frequency of the signal under test and the frequency of the output of NCO 50. Thus, when mixing the signal under test and the output of NCO 50 with the offset, the output of the digital frequency converter 30 may provide a signal with a carrier frequency corresponding to this offset.

The output of digital frequency converter 30 may be used for further operations. For example, as will be described below in more detail, a power level of the output may be determined. However, any other kind of operation or analysis may be also applied to the output. In particular, it may be possible to provide the output of digital frequency converter 30 to a filter 60. In case that the frequency of the signal provided by NCO 50 corresponds to the frequency of the signal under test, the output of the digital frequency converter may be a signal in the baseband. Accordingly, the output of digital frequency converter 30 may be filtered by a low-pass filter. Alternatively, if an offset is applied between the frequency of the signal under test and the output of NCO 50, the output of digital frequency converter 30 may be a signal with a carrier frequency according to the offset. In this case, the output of digital frequency converter 30 may be filtered by a bandpass filter having a center frequency corresponding to the offset applied in the control loop for controlling the frequency of NCO 50.

Since the frequency of the output of NCO 50 is controlled according to the tracked frequency of the signal under test, the output of NCO 50 may compensate variations in the frequency of signal under test. Accordingly, the output of digital frequency converter 30 is not affected by the variations in the frequency of the signal under test. Thus, all further operations applied to the output of digital frequency converter 30 may be directed to a specific frequency or a very narrow frequency range or bandwidth. In particular, filter 60 for filtering the output of digital frequency converter 50 may have a very narrow filtering bandwidth.

In case that the signal under test may relate to a signal with a single frequency, the filter bandwidth of filter 60 may be very small, for example only 10 Hz, or even only 5 Hz. However, depending on the signal under test and the desired application, it may be also possible to apply a different filter bandwidth, for example 100 Hz, 50 Hz, 30 Hz or only 2 Hz or 1 Hz.

In order to continuously adapt the frequency of the output provided by NCO 50 according to frequency variations of the signal under test, the control loop for tracking the frequency of the signal under test continuously performs the frequency tracking in real-time. Accordingly, any variations in the frequency of the signal under test can be compensated within a very short period of time, and thus, the output of digital frequency converter 50 always relates to constant frequency properties.

Figure 2:
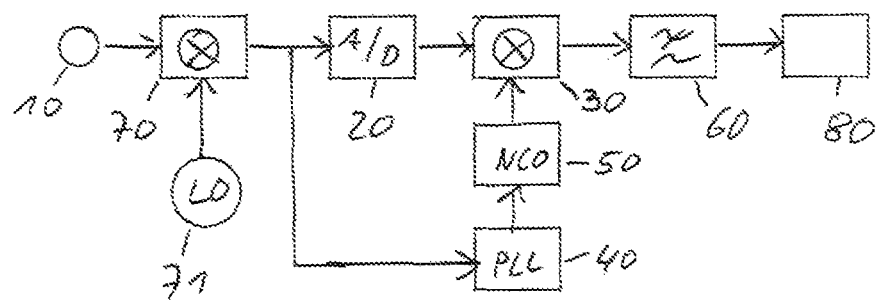
FIG. 2: shows a schematic block diagram of a signal processing apparatus according to a further embodiment.

FIG. 2 shows a further embodiment of a signal processing apparatus 1 according to an embodiment. The embodiment according to FIG. 2 mainly comprises all features of the embodiment as described above in connection with FIG. 1. Thus, the explanation with respect to FIG. 1 also applies to the embodiment of FIG. 2. Accordingly, explanations of features in the following may also apply to the embodiment of FIG. 1 as far as possible.

As can be seen in FIG. 1, signal processing apparatus 1 may further comprise an analogue frequency converter 70. For example, analogue frequency converter 70 may be an analogue mixer for mixing the analogue signal under test with a further frequency provided, for example, by a local oscillator (LO) 71. In this way, a signal under test in the range of very high frequencies may be down converted to an intermediate frequency. The output of analogue frequency converter 70 may be provided to analogue-to-digital converter 20. Accordingly, the further operations applied to this intermediate frequency signal may correspond to the operations as described above in connection with FIG. 1.

The output of digital frequency converter 50, in particular the filtered output provided by filter 60 may be provided to any appropriate device for further measuring or analyzing the signal. For example, a power detector 80 may measure a power level of the (filtered) output of digital frequency converter 50. The result of this measurement of the power level may be used, for example, for calibrating signal source 100 which provides the signal under test. However, it is understood, that any other analysis or operation may be applied to the output of digital frequency converter 50. Since the output of digital frequency converter 50 leads to a signal of a relative constant frequency without the impact of frequency variations of the signal under test, all further operations such as filtering, measurement or analysis may be subjected to a very small frequency range. Thus, impact of noise or other disturbances can be easily reduced by applying a relative small filter bandwidth to filter 60.

Figure 3:
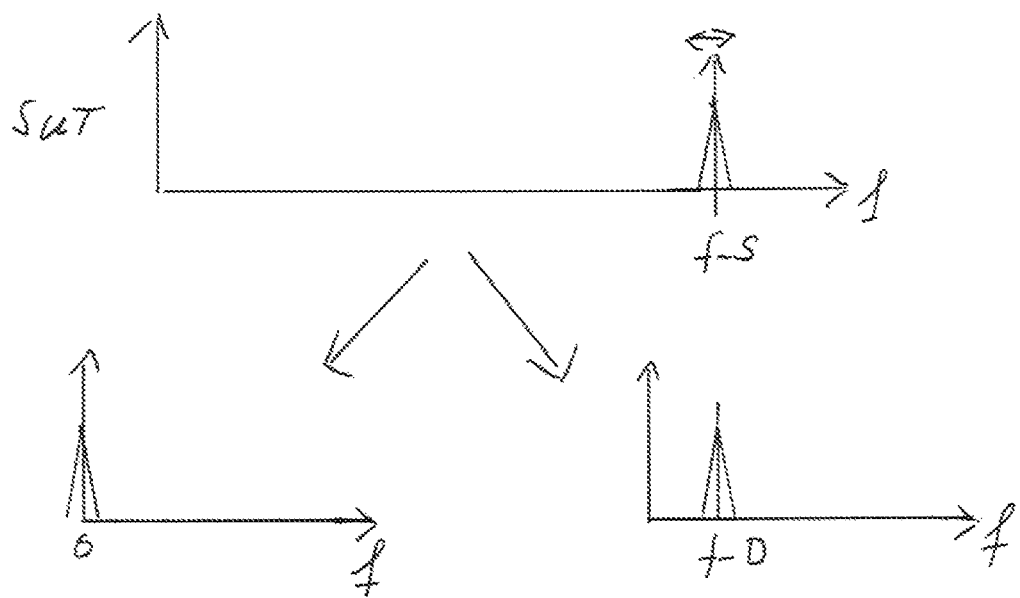
FIG. 3: shows a schematic diagrams of signal in a signal processing apparatus according to an embodiment.

FIG. 3 shows a diagram illustrating the operation of a signal processing apparatus 1 according to an embodiment. The signal processing may be applied, for example by a signal processing apparatus 1 according to FIG. 1 or FIG. 2.

As can be seen in the upper row of FIG. 3, a signal under test may be a signal with a specific frequency $f\_S$. However, this specific frequency $f\_S$ may slightly vary. This variation of frequency $f\_S$ may be tracked by a control loop comprising a frequency tracking device 40. By generating a further signal with a frequency which is the same as the tracked frequency f_S of the signal under test, and further mixing the signal under test and the further signal, the result of this mixing operation may be a baseband signal having a center frequency of zero, as shown on the left hand side of the bottom row of FIG. 3. Since the frequencies of both signals which are mixed by digital frequency converter 30 change in a same manner, the impact of variations in the frequency f_S is compensated.

As already mentioned above, it may be possible to apply an offset to the frequency of the signal generated by NCO 50. Accordingly, the output of digital frequency converter 30 may be a signal with a center frequency corresponding to this offset f_D. This is illustrated on the right hand side in the bottom line of FIG. 3.

Even though the above described examples always are provided in connection with down converting a frequency of a radio frequency signal, the present invention may be also applied by mixing the signal under test with a further frequency of NCO 50 in order to obtain an up-conversion of the frequency of the signal under test to a higher frequency. Since an output of a mixer usually comprises both, the sum and the difference of the two input signals, the respective frequency component may be selected, for example, by filtering the output of digital frequency converter 30.

Figure 4:
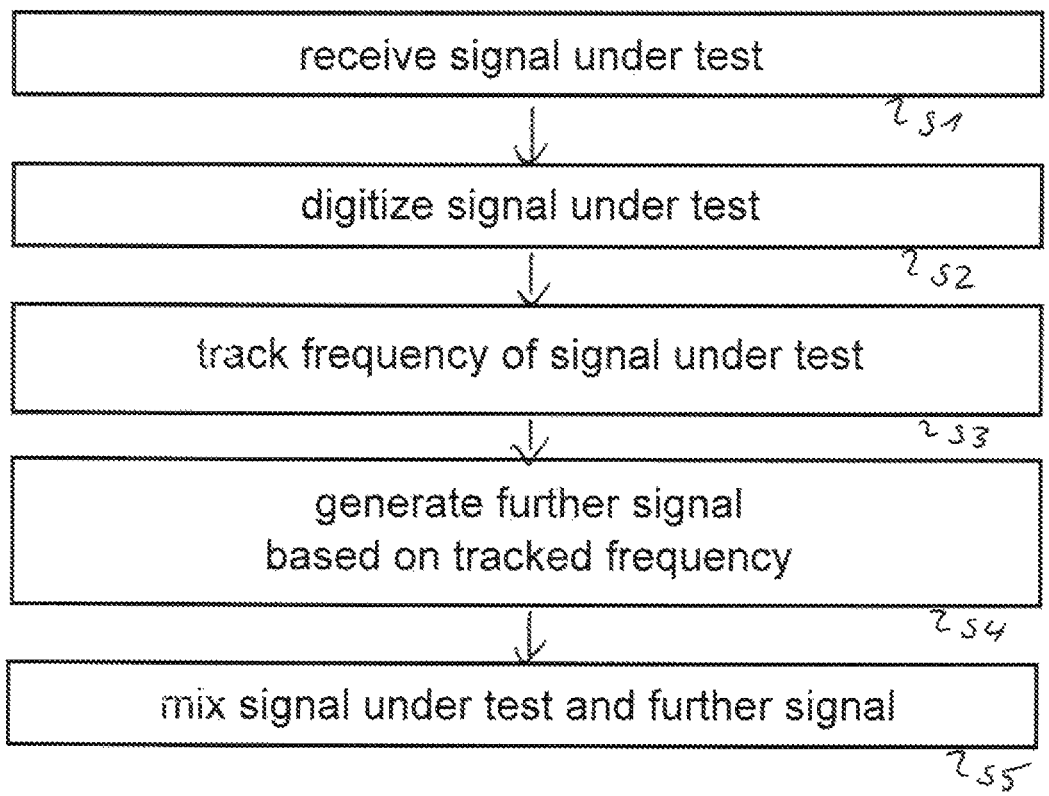
FIG. 4: shows a flow diagram of a method according to an embodiment.

FIG. 4 shows a flow diagram illustrating a method for mixing a high frequency signal, in particular mixing a high frequency signal with frequency variations. The method may mix a high frequency signal with frequency variations to a predetermined frequency.

In a step S1, an analogue signal under test is received. For example, the analogue signal may be received by an input device 10. In a step S2, the received analogue signal under test is digitized. For example, the received analogue signal under test may be digitized by an analogue-to-digital converter 30. In step S3, a frequency of the analogue signal under test may be tracked. Additionally or alternatively, the frequency of the digitized signal under test may be tracked. The tracking of the frequency of the signal under test may be performed, for example, by a frequency tracking device 40. For example, the frequency tracking may be performed by a phase-locked loop (PLL).

Further, in a step S4, a digital signal with a predetermined frequency is generated. The digital signal may be generated, for example, by a numerically-controlled oscillator (NCO) 50. The predetermined frequency may be set based on the tracked frequency. In step S5, the digitized signal under test and the generated digital signal are mixed. For example, the mixing may be performed, by a digital frequency converter 30.

Accordingly, a control loop for controlling the frequency of the digital representation by NCO 50 may be established by controlling the output frequency of NCO 50 in response to a comparison between the frequency of the signal under test and the frequency of the output of NCO 50.

The predetermined frequency of the generated representation of a waveform of NCO 50 may be continuously adapted in response to a variation of the tracked frequency in real-time.

The tracking of the analogue signal under test or the digitized signal under test may be performed, for example, by a phase-locked loop.

The predetermined frequency of the output provided by NCO 50 may be set to the tracked frequency. Accordingly, the frequency of the output of NCO 50 may correspond to the frequency of the signal under test.

Alternatively, an offset may be added to the tracked frequency to obtain the predetermined frequency of the output of NCO 50.

The method may further comprise converting the received analogue signal under test to an intermediate frequency. In this case, the converted analogue signal may be digitized and further processed.

The method may further comprise a step of applying a filtering operation to the result of the mixing. In particular, the filtering may be performed by applying a predetermined filter bandwidth.

The filtering may comprise a low-pass filtering or a bandpass filtering. In particular, the filtering may apply a narrow filter bandwidth. For example, the filter bandwidth may be equal or less than 10 Hz.

The method may further comprise a step of determining a power level of the filtered signal.

Summarizing, the present invention relates to a processing of a signal under test in order to compensate frequency variations in the signal under test. For this purpose, the signal under test is mixed with a further digital signal. A frequency of the further signal which is used for mixing with the signal under test may be adapted in real-time according to frequency variations in the signal under test.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention.

Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 signal processing apparatus
10 input
20 A/D converter
30 digital frequency converter
40 frequency tracking device
50 numerically-controlled oscillator
60 filter
70 analogue frequency converter
71 local oscillator
80 power detector
100 signal generator

The invention claimed is:

1. A signal processing apparatus for mixing a high frequency signal with frequency variation to a predetermined frequency bandwidth, the signal processing apparatus comprising:
an input for receiving an analogue signal under test;
an analogue-to-digital converter for digitizing the received analogue signal under test;
a numerically-controlled oscillator, NCO, for generating a digital signal with a predetermined frequency;
a digital frequency converter for mixing the digitized signal under test provided by the analogue-to-digital converter and the digital representation of a waveform generated by the NCO; and
a frequency tracking device for tracking a frequency of the analogue signal under test or the digitized signal under test,
wherein the NCO is configured to set the predetermined frequency of the NCO based on the frequency tracked by the frequency tracking device,
wherein the frequency tracking device is configured to receive the digital signal provided by the NCO and to compare the digital signal with the frequency of the signal under test which is tracked by the frequency tracking device, and
wherein the predetermined frequency of the digital signal generated by the NCO is continuously adapted in response to a variation of the frequency tracked by the frequency tracking device in real-time,
wherein an offset between the frequency of the signal under test and the predetermined frequency of the digital signal generated by the NCO is applied such that the mixed signal of the digital frequency converter provides a signal with a carrier frequency corresponding to the offset.

2. The signal processing apparatus of claim 1, wherein the frequency tracking device comprises a phase-locked loop.

3. The signal processing apparatus of claim 1, wherein the predetermined frequency of the digital signal generated by the NCO is set to the tracked frequency tracked by the tracking device.

4. The signal processing apparatus of claim 1, comprising an analog frequency converter for converting the received analog signal under test to an intermediate frequency and providing the converted signal to the analogue-to-digital converter.

5. The signal processing apparatus of claim 1, comprising a filter for receiving an output of the digital frequency converter and applying a filtering by a predetermined filter bandwidth to the received output of the digital frequency converter.

6. The signal processing apparatus of claim 5, wherein the filter is a low-pass filter.

7. The signal processing apparatus of claim 5, wherein filter is configured to apply a narrow filter bandwidth, in particular a filter bandwidth equal or less than 10 Hz.

8. The signal processing apparatus of claim 5, comprising a power detector for determining a power level of the filtered signal output by the filter.

9. A method for mixing a high frequency signal with frequency variation to a predetermined frequency bandwidth, the method comprising:
receiving an analogue signal under test;
digitizing the received analogue signal under test;
tracking a frequency of the analogue signal under test or the digitized signal under test,
generating a digital representation of a waveform comprising a digital signal with a predetermined frequency, wherein the predetermined frequency is set based on the tracked frequency;
mixing the digitized signal under test and the digital representation of a waveform;
comparing the generated digital signal with the tracked frequency of the signal under test; and
continuously adapting the predetermined frequency of the digital signal in response to a variation of the tracked frequency of the signal under test in real-time,
wherein an offset between the frequency of the signal under test and the predetermined frequency of the digital signal is applied such that the mixed signal provides a signal with a carrier frequency corresponding to the offset.

10. The method of claim 9, wherein the tracking of the analogue signal under test or the digitized signal under test is performed by a phase-locked loop.

11. The method of claim 9, wherein the frequency of the generated digital signal is set to the tracked frequency.

12. The method of claim 9, comprising converting the received analog signal under test to an intermediate frequency, wherein digitizing the signal under test is digitizing the converted signal.

13. The method of claim 9, comprising applying a filtering to a result of the mixing, wherein the filtering is performed by a predetermined filter bandwidth.

14. The method of claim 13, wherein the filtering comprises a low-pass filtering.

15. The method of claim 13, wherein filtering applies a narrow filter bandwidth, in particular a filter bandwidth equal or less than 10 Hz.

16. The method of claim 13, comprising determining a power level of the filtered signal.

* * * * *